(12) United States Patent
Tanahashi et al.

(10) Patent No.: US 8,419,201 B2
(45) Date of Patent: Apr. 16, 2013

(54) LIGHT EMITTING MODULE

(75) Inventors: Osamu Tanahashi, Kyotanabe (JP);
Satoshi Fukano, Ikoma (JP); Shintarou Hayashi, Kobe (JP); Shinichi Anami, Hirakata (JP); Shigetsugu Sumiyama, Hirakata (JP); Motohiro Saimi, Takarazuka (JP); Hideharu Kawachi, Kobe (JP)

(73) Assignee: Panasonic Corporation, Osaka (JP)

( * ) Notice: Subject to any disclaimer, the term of this patent is extended or adjusted under 35 U.S.C. 154(b) by 393 days.

(21) Appl. No.: 12/913,137

(22) Filed: Oct. 27, 2010

(65) Prior Publication Data
US 2011/0095701 A1    Apr. 28, 2011

(30) Foreign Application Priority Data
Oct. 27, 2009    (JP) .................................. 2009-246810

(51) Int. Cl.
*F21V 9/16*    (2006.01)
*G09G 3/30*    (2006.01)

(52) U.S. Cl.
USPC .............. 362/84; 362/231; 362/382; 313/504

(58) Field of Classification Search .............. 362/231, 362/84, 249.02, 382; 313/238, 243, 504; 257/99
See application file for complete search history.

(56) References Cited

U.S. PATENT DOCUMENTS

| | | | |
|---|---|---|---|
| 6,348,359 B1 * | 2/2002 | Van Slyke et al. .............. 438/29 |
| 6,774,574 B1 * | 8/2004 | Koyama ..................... 315/169.3 |
| 7,465,064 B2 * | 12/2008 | Breinich et al. .............. 362/231 |
| 7,486,007 B2 * | 2/2009 | Lee ................................. 313/239 |
| 2002/0068191 A1 * | 6/2002 | Kobayashi .................... 428/690 |
| 2008/0198593 A1 | 8/2008 | Breinich et al. |

FOREIGN PATENT DOCUMENTS

| | | |
|---|---|---|
| DE | 20 2006 010 269 | 10/2006 |
| DE | 20 2007 011 908 | 11/2007 |
| EP | 1 367 676 | 12/2003 |
| EP | 1 921 644 | 5/2008 |
| JP | 2007-529177 | 10/2007 |

OTHER PUBLICATIONS

The extended European search report dated Apr. 27, 2012.

* cited by examiner

*Primary Examiner* — Peggy A. Neils
(74) *Attorney, Agent, or Firm* — Bacon & Thomas, PLLC

(57) ABSTRACT

A light emitting module includes an organic EL light emitting element and a support body supporting the organic EL light emitting element. The support body is attached to the organic EL light emitting element at the side of the non-light emitting surface of the light emitting module to cover one surface of the organic EL light emitting element. The organic EL light emitting element includes power feeding electrodes. The support body includes openings formed in a corresponding relationship with the power feeding electrodes. The power feeding electrodes exposed on the non-light emitting side of the support body through the openings. The support body includes power feeding terminals. The power feeding terminals partially exposed on the non-light emitting side of the support body. The power feeding terminals electrically connected to the power feeding electrodes by electric connection members extending via the non-light emitting side and the openings of the support body.

11 Claims, 11 Drawing Sheets

LIGHT EMITTING MODULE

FIELD OF THE INVENTION

The present invention relates to a light emitting module provided with an organic electroluminescence (hereinafter referred to as "EL") light emitting element.

BACKGROUND OF THE INVENTION

Conventionally, there is known a light emitting module that includes an organic EL light emitting element (hereinafter referred to as "light emitting element"), a support body for supporting the light emitting element at the opposite side from the light emitting surface and a power feeding terminals provided in the support body for feeding electric power to the light emitting element (see, e.g., Japanese Patent Application Publication No. 2007-529177). The power feeding terminals are current supplying electrodes electrically connected to the element electrodes of the light emitting element and are arranged in, e.g., an element control circuit board held by the support body.

In the conventional light emitting module mentioned above, however, lead lines for interconnecting the element electrodes and the power feeding terminals are arranged at the side of the light emitting surface of the light emitting element. Thus, the lead lines tend to catch the user's eye and provide undesirable outward appearance if the light emitting module is used as, e.g., a display or an indoor illumination device. As a solution to this problem, the lead lines may be covered with a decoration cover. In this case, it becomes difficult to attach or remove the lead lines once the decoration cover is mounted in place. This impedes e.g., repair or checkup.

SUMMARY OF THE INVENTION

In view of the above, the present invention provides a light emitting module capable of making it possible to easily perform a wiring work between power feeding electrodes and power feeding terminals, capable of allowing a user to easily rearrange wiring lines even after the light emitting module is assembled and capable of making the wiring lines arranged between the power feeding electrodes and the power feeding terminals unnoticeable at the side of the light emitting surface of a light emitting element.

In accordance with an embodiment of the present invention, there is provided a light emitting module having a light emitting surface and a non-light emitting surface opposite from the light emitting surface, including: an organic EL light emitting element of thin plate shape including a light emitting layer made of an organic compound and positive and negative electrodes for interposing the light emitting layer therebetween; and a support body for supporting the organic EL light emitting element, the support body including a non-light emitting side, wherein the support body is attached to the organic EL light emitting element at the side of the non-light emitting surface of the light emitting module to cover one surface of the organic EL light emitting element; the organic EL light emitting element includes power feeding electrodes electrically connected to the positive and negative electrodes; the support body includes openings formed in a corresponding relationship with the power feeding electrodes, so that the power feeding electrodes are exposed on the non-light emitting side of the support body through the openings; and the support body includes power feeding terminals for supplying electric power to the organic EL light emitting element, the power feeding terminals having a portion exposed on the non-light emitting side of the support body, the power feeding terminals being electrically connected to the power feeding electrodes by electric connection members extending via the non-light emitting side and the openings of the support body.

With such configuration, the power feeding terminals and the power feeding electrodes to be electrically connected by the electric connection members are provided on the non-light emitting side (the rear side) of the support body. Therefore, the task of bonding the electric connection members to the power feeding terminals and the power feeding electrodes can be performed only at the rear side of the support body, eventually making it possible to enhance the productivity of the present light emitting module. Since the power feeding electrodes are exposed on the rear side of the support body, the task of attaching and removing the electric connection members to and from the power feeding electrodes can be readily carried out even after the light emitting module is assembled. In addition, the power feeding terminals and the power feeding electrodes are provided on the rear side of the support body and are electrically connected at the rear side of the light emitting module. This prevents the electric connection members from being exposed on the light emitting surface of the light emitting element, thereby ameliorating the outward appearance of the present light emitting module.

The power feeding electrodes of the organic EL light emitting element may include positive and negative power feeding electrodes electrically connected to the positive and negative electrodes, the openings of the support body independently arranged in a corresponding relationship with the positive and negative power feeding electrodes.

The positive and negative power feeding electrodes may be arranged in an adjoining relationship with each other, the openings of the support body divided by partition portions to isolate the power feeding electrodes of different polarities from each other and independently arranged in a corresponding relationship with the power feeding electrodes of different polarities.

With such configuration, it is possible to connect the electric connection members to the power feeding electrodes with no likelihood of mutual contact even if the electric connection members are formed of naked wires.

The light emitting module may further include a circuit board making up a circuit for generating and/or controlling the electric power to be supplied to the organic EL light emitting element, wherein the circuit board is provided on the side of the support body at which the organic EL light emitting element is supported, the circuit board being arranged side by side with respect to the organic EL light emitting element; the power feeding terminals are provided on the circuit board; and the support body includes additional openings formed in a corresponding relationship with the power feeding terminals, the power feeding terminals being exposed on the non-light emitting side of the support body through the additional openings.

The light emitting module may further include a circuit board making up a circuit for generating and/or controlling the electric power to be supplied to the organic EL light emitting element, wherein the circuit board is provided on the opposite side of the support body from the side at which the organic EL light emitting element is supported; and the power feeding terminals are provided on the circuit board and exposed on the non-light emitting side of the support body.

With such configuration, the task of bonding the electric connection members to the power feeding terminals and the power feeding electrodes can be performed only at the rear side of the support body even if there is provided a circuit board making up a circuit for generating and/or controlling the electric power to be supplied to the organic EL light emitting element.

Groove portions for insertion of the electric connection members may be formed on the non-light emitting side of the support body.

With such configuration, it is possible to prevent the electric connection members extending between the power feeding terminals and the power feeding electrodes from making contact with each other, thereby assuring electric insulation. Since the electric connection members are held in the groove portions, it is possible to prevent the electric connection members from being disconnected by an external force. Furthermore, it is possible to prevent the electric connection members from being disconnected by the vibration repeatedly applied over time to the electric connection members formed of copper wires or aluminum wires.

The thickness direction depths of the groove portions may vary with the polarities of the electric connection members.

With such configuration, it is possible to three-dimensionally arrange the electric connection members in the thickness direction of the light emitting module. This increases the degree of freedom of wiring design and helps save the space of the light emitting module while reducing the thickness thereof.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

First Embodiment

Figure 1:
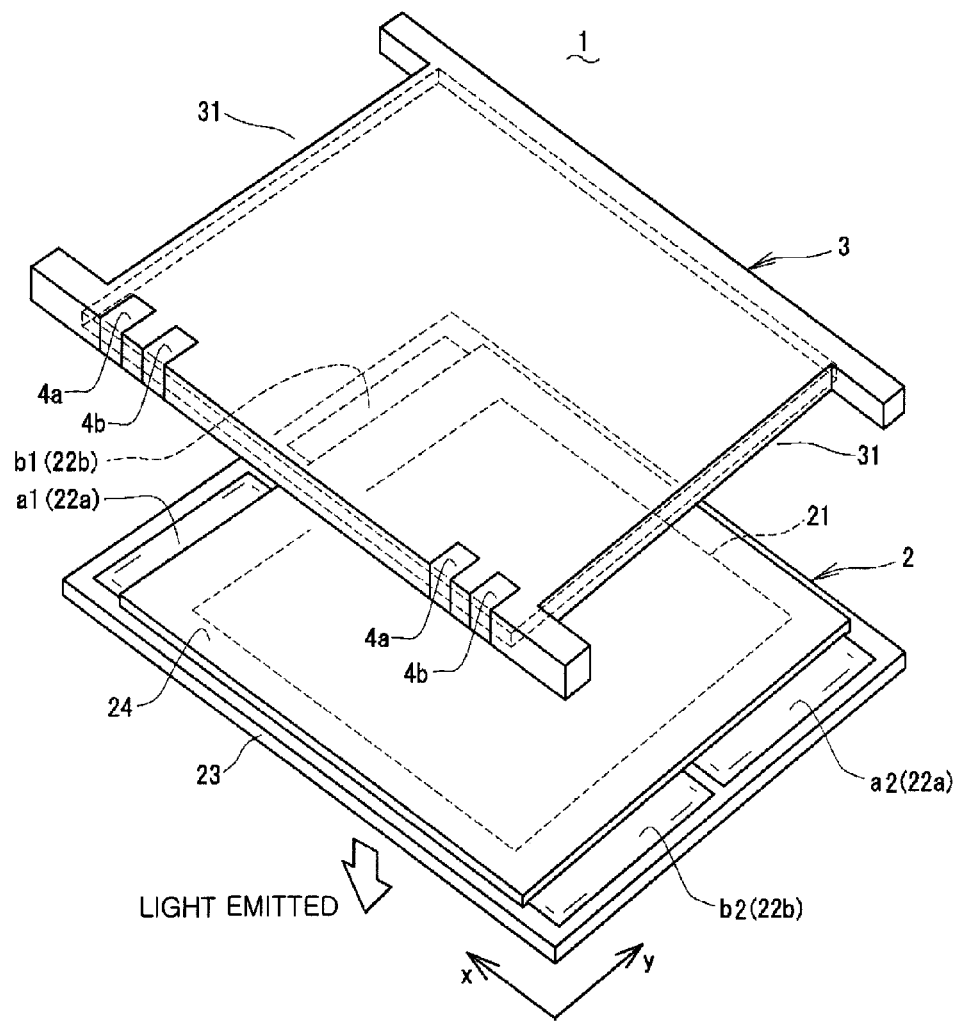
FIG. 1 is an exploded perspective view showing a light emitting module in accordance with a first embodiment of the present invention.

A light emitting module in accordance with a first embodiment of the present invention will be described with reference to FIGS. 1 through 3. As shown in these drawings, the light emitting module 1 includes a plate-shaped organic EL light emitting element (hereinafter referred to as "light emitting element") 2, a support body 3 for supporting the light emitting element 2, and power feeding terminals 4a and 4b provided in the support body 3 for feeding electric power to the light emitting element 2. The light emitting module 1 emits light from one side (light emitting surface) of the light emitting element 2 from the side supported by the support body 3. In the following description, the direction designated by "x" will be defined as the left-right direction of the light emitting module 1 and the direction designated by "y" as the front-rear direction of the light emitting module".

The light emitting element 2 includes a light emitting layer 21 (the hatched portion in FIG. 3), positive and negative electrodes 22a and 22b for interposing the light emitting layer 21 between the surfaces thereof, a transparent element substrate 23 on which the positive and negative electrodes 22a and 22b are provided, and a seal plate 24 for sealing the light emitting layer 21 and the positive and negative electrodes 22a and 22b. The light emitting layer 21 is formed of an organic thin film containing an organic compound. The positive electrode 22a is a transparent electrode made of ITO (indium tin oxide) and is provided on the element substrate 23. The positive electrode 22a includes a pair of left and right lead-out portions a1 and a2 protruding outwards beyond the seal plate 24. The left lead-out portion a1 is arranged in the front area on the element substrate 23 but the right lead-out portion a2 is arranged in the rear area on the element substrate 23. Just like the positive electrode 22a, the negative electrode 22b is made up of a transparent electrode and is provided on the light emitting layer 21. The negative electrode 22b includes a pair of left and right lead-out portions b1 and b2 protruding outwards beyond the seal plate 24. The left lead-out portion b1 is arranged in the rear area on the element substrate 23 but the right lead-out portion b2 is arranged in the front area on the element substrate 23. The lead-out portions a1, a2, b1 and b2 are electrically connected to the positive and negative electrodes 22a and 22b and make up the power feeding electrodes of the light emitting element 2. The power feeding electrodes are produced by forming a thin aluminum film or a thin MAM (molybdenum-aluminum-molybdenum) film on ITO through sputtering or other methods.

Figure 3:
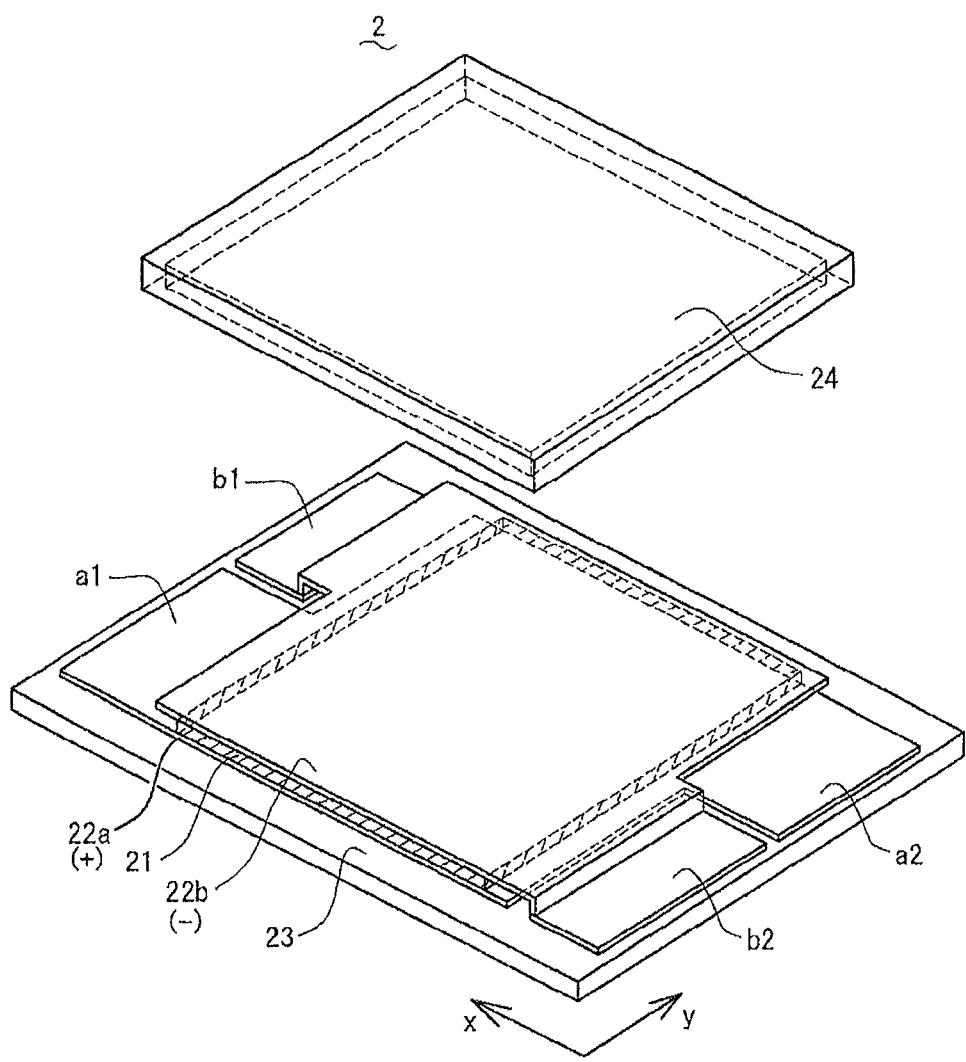
FIG. 3 is an exploded perspective view showing an organic EL light emitting element employed in the light emitting module of the first embodiment.

As is apparent in FIG. 3, the power feeding electrodes a1 and a2 or the power feeding electrodes b1 and b2 are in a point-to-point symmetrical relationship with respect to the center of the light emitting element 2. The adjoining power feeding electrodes a1 and b1 or the adjoining power feeding electrodes a2 and b2 differ in polarity from each other.

The negative electrode 22b is not always a transparent electrode but may be an electrode made of, e.g., aluminum. In the present embodiment, if the negative electrode 22b is transparent, the light emitting element 2 becomes a double-side light emitting type that emits light from the opposite surfaces thereof. Since one surface of the light emitting element 2 is covered by the below-mentioned support body 3, however, the light emitting module 1 serves as a single-side light emitting module.

If electric power is supplied to the light emitting element 2 through the power feeding electrodes a1 and a2 and the power feeding electrodes b1 and b2 so that a voltage is applied between the positive electrode 22a and the negative electrode 22b, the electrons and holes implanted into the light emitting layer 21 as carriers are coupled again to generate exciters, thereby causing the light emitting layer 21 to emit light.

The element substrate 23 is made of a material with superior translucency, e.g., glass or transparent resin, and has a light emitting surface formed on the front side, namely on the opposite side to the side at which the light emitting layer 21 exists. The seal plate 24 has a planar shape of a downwardly-opened can shape and is made of, e.g., metal or glass. The seal plate 24 is arranged in an opposing relationship with the element substrate 23. The light emitting element 2 may include a hole transport layer provided between the light emitting layer 21 and the positive electrode 22a for improving the hole implantation into the light emitting layer 21 and an electron transport layer provided between the light emitting layer 21 and the negative electrode 22b for enhancing the electron implantation into the light emitting layer 21.

The support body 3 is a substantially rectangular cover with a recessed lower surface and is installed such that the recessed lower surface faces the non-light emitting surface of the light emitting element 2. Thus, the support body 3 covers the non-light emitting surface of the light emitting element 2. The support body 3 is not limited to the substantially rectangular one and may have a shape conforming to the contour of the light emitting element 2.

The support body 3 is fixed to the light emitting element 2 by, e.g., an adhesive agent curable at a low temperature. The support body 3 has openings 31 in the portions corresponding to the power feeding electrodes a1 and a2 and the power feeding electrodes b1 and b2 of the electrodes 22a and 22b.

The power feeding electrodes a1 and a2 and the power feeding electrodes b1 and b2 are exposed to the non-light emitting side (the rear side) of the support body 3 through the openings 31. The openings 31 are formed on the opposite lateral sides of the support body 3.

Figure 2:
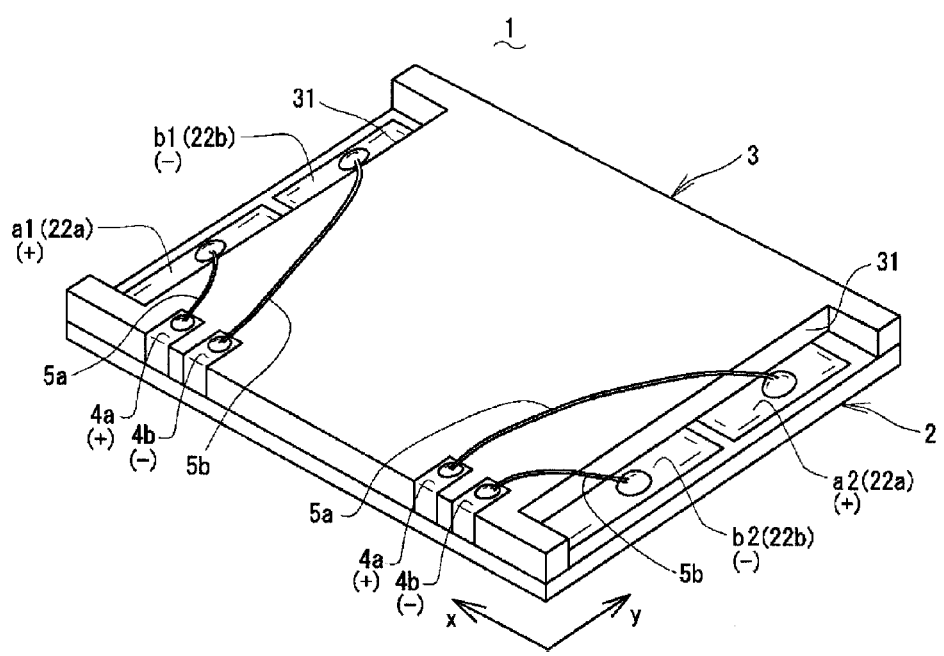
FIG. 2 is an assembled perspective view of the light emitting module of the first embodiment.

Although, as shown in FIG. 2, the support body 3 of the present embodiment covers substantially the entire area of the non-light emitting surface of the light emitting element 2 except for the portions corresponding to the openings 31, it is not limited thereto. For example, the support body 3 may be configured to expose other portions of the non-light emitting surface of the light emitting element 2 as well as the portions corresponding the openings 31.

The power feeding terminals 4a and 4b serve to receive electric power from an external power source (not shown) and feed it to the light emitting element 2. The power feeding terminals 4a and 4b are provided in the frontal left and right areas of the rear surface of the support body 3. As shown in FIG. 1, the power feeding terminals 4a and 4b are formed into a substantially L-like shape and are arranged over the side surface and the rear surface of the support body 3. Thus, the power feeding terminals 4a and 4b are at least partially exposed to the non-light emitting side (the rear side) of the support body 3. The power feeding terminals 4a are electrically connected to the corresponding left and right power feeding electrodes a1 and a2 of the positive electrode 22a through electric connection members 5a. The power feeding terminals 4b are electrically connected to the corresponding left and right power feeding electrodes b1 and b2 of the negative electrode 22b through electric connection members 5b. The electric connection members 5a and 5b extend via the non-light emitting side (the rear side) and the openings 31 of the support body 3. The electric connection members 5a and 5b are formed of conductive wires such as copper wires, aluminum wires or gold wires and are bonded to the power feeding electrodes a1, a2, b1 and b2 and the power feeding terminals 4a and 4b by an ultrasonic bonding method.

The electric connection members 5a and 5b are not limited to the copper wires, the aluminum wires or the gold wires but may be formed of thin conductive films with flexibility.

The electric connection members 5a and 5b and the power feeding electrodes a1, a2, b1 and b2 may be bonded to each other using conductive paste. By electrically connecting two sets of the left and right power feeding terminals 4a and 4b to the power feeding electrodes a1 and a2 and the power feeding electrodes b1 and b2 respectively arranged in a point-to-point symmetrical relationship as set forth above, it becomes possible to stably supply electric power to all the electrodes 22a and 22b.

Since the ITO making up the transparent electrodes is a conductive material having relatively low electric conductivity, it is sometimes the case that, if the area of the light emitting element gets greater, a voltage drop may occur and a brightness unevenness may be generated as the light emitting element extends away from the power feeding electrodes. By electrically connecting two sets of the left and right power feeding terminals 4a and 4b to the power feeding electrodes a1 and a2 and the power feeding electrodes b1 and b2 respectively arranged in a point-to-point symmetrical relationship, it is possible to reduce the voltage drop rate in a position distant from the power feeding electrodes of the light emitting element 2 and to prevent occurrence of the brightness unevenness otherwise caused by the distance from the power feeding electrodes.

With the light emitting module 1 of the present embodiment, the power feeding terminals 4a and 4b and the power feeding electrodes a1, a2, b1 and b2 are provided on the non-light emitting side (the rear side) of the support body 3. Therefore, the task of bonding the electric connection members 5a and 5b to the power feeding terminals 4a and 4b and the power feeding electrodes a1, a2, b1 and b2 can be performed only at the rear side of the support body 3, eventually making it possible to enhance the productivity of the present light emitting module 1. Since the power feeding electrodes a1, a2, b1 and b2 are drawn from the positive and negative electrodes 22a and 22b and exposed on the rear side of the support body 3, the tasks of attaching and removing the electric connection members 5a and 5b to and from the power feeding electrodes a1, a2, b1 and b2 can be readily carried out even after the light emitting module 1 is assembled. In addition, the power feeding terminals 4a and 4b and the power feeding electrodes a1, a2, b1 and b2 are provided on the rear side of the support body 3 and are electrically connected at the rear side of the light emitting module 1. This prevents the electric connection members 5a and 5b from being exposed on the light emitting surface of the light emitting element 2, thereby ameliorating the outward appearance of the present light emitting module 1.

Inasmuch as the electric connection members 5a and 5b and the power feeding electrodes a1, a2, b1 and b2 are bonded to each other by an ultrasonic bonding method, it is possible to reduce the thermal damage to the light emitting element 2.

Second Embodiment

Figure 4:
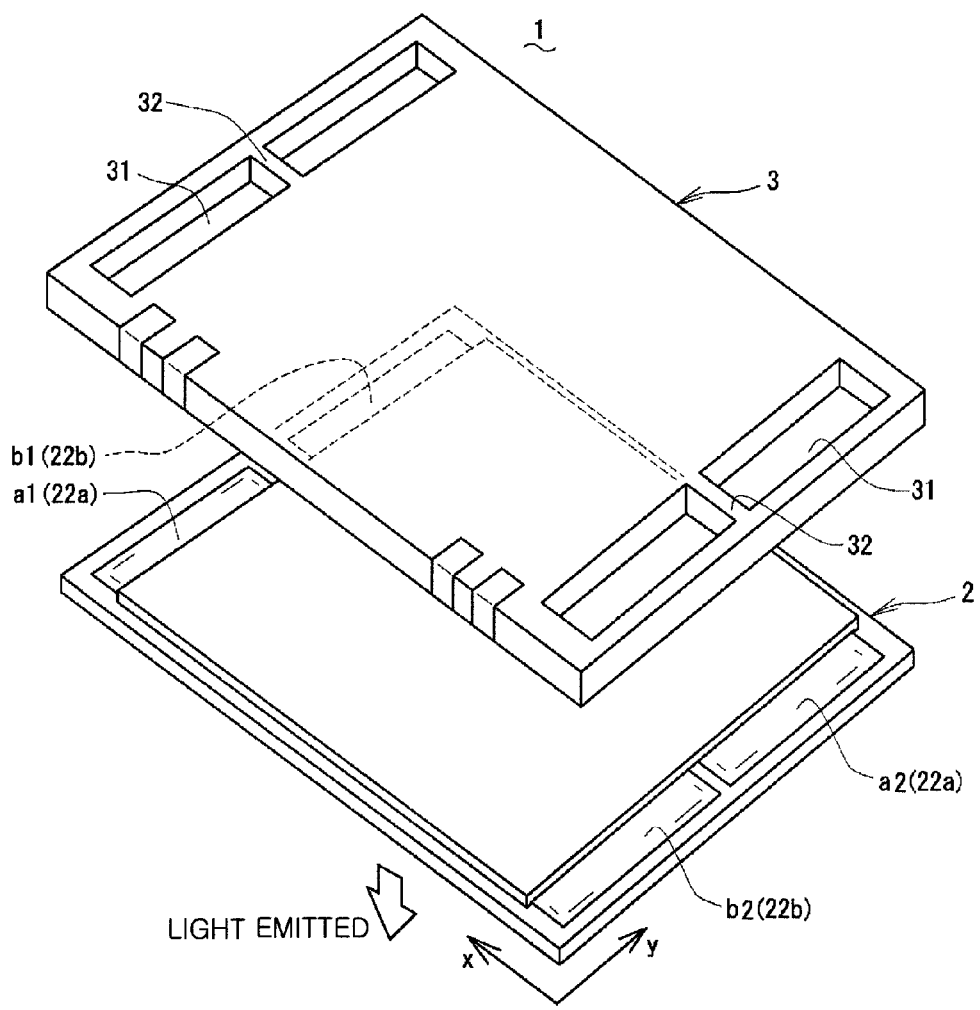
FIG. 4 is an exploded perspective view showing a light emitting module in accordance with a second embodiment of the present invention.
Figure 5:
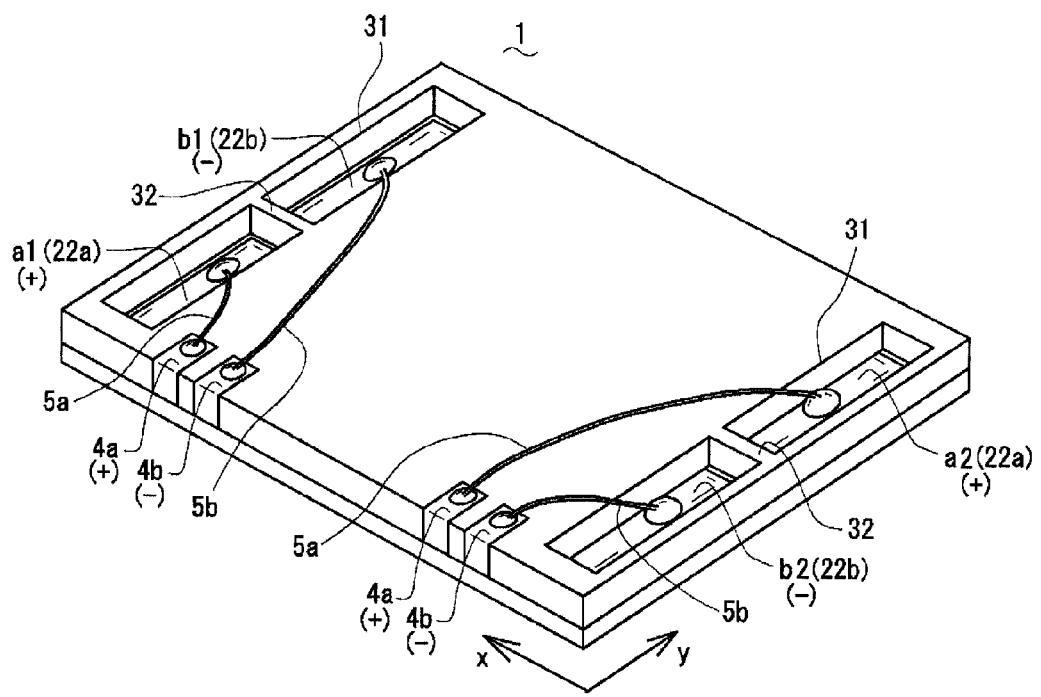
FIG. 5 is an assembled perspective view of the light emitting module of the second embodiment.

A light emitting module in accordance with a second embodiment of the present invention will be described with reference to FIGS. 4 and 5. As shown in these drawings, each of the openings 31 of the support body 3 employed in the light emitting module 1 of the present embodiment is formed into a rectangular shape at the opposite lateral sides of the support body 3 and is provided with a partition portion 32 for partitioning the mutually adjoining power feeding electrodes a1 and b1 of different polarities and the mutually adjoining power feeding electrodes a2 and b2 of different polarities. This provides independent openings in a corresponding relationship with the power feeding electrodes a1 and b1 and the power feeding electrodes a2 and b2. Other configurations remain the same as above.

With the light emitting module 1 of the present embodiment, each of the openings 31 is partitioned in a corresponding relationship with the mutually adjoining power feeding electrodes a1 and b1 of different polarities and the mutually adjoining power feeding electrodes a2 and b2 of different polarities. Therefore, it is possible to connect the electric connection members 5a and 5b to the power feeding electrodes a1, a2, b1 and b2 with no likelihood of mutual contact even if the electric connection members 5a and 5b are formed of naked wires.

Third Embodiment

Figure 6:
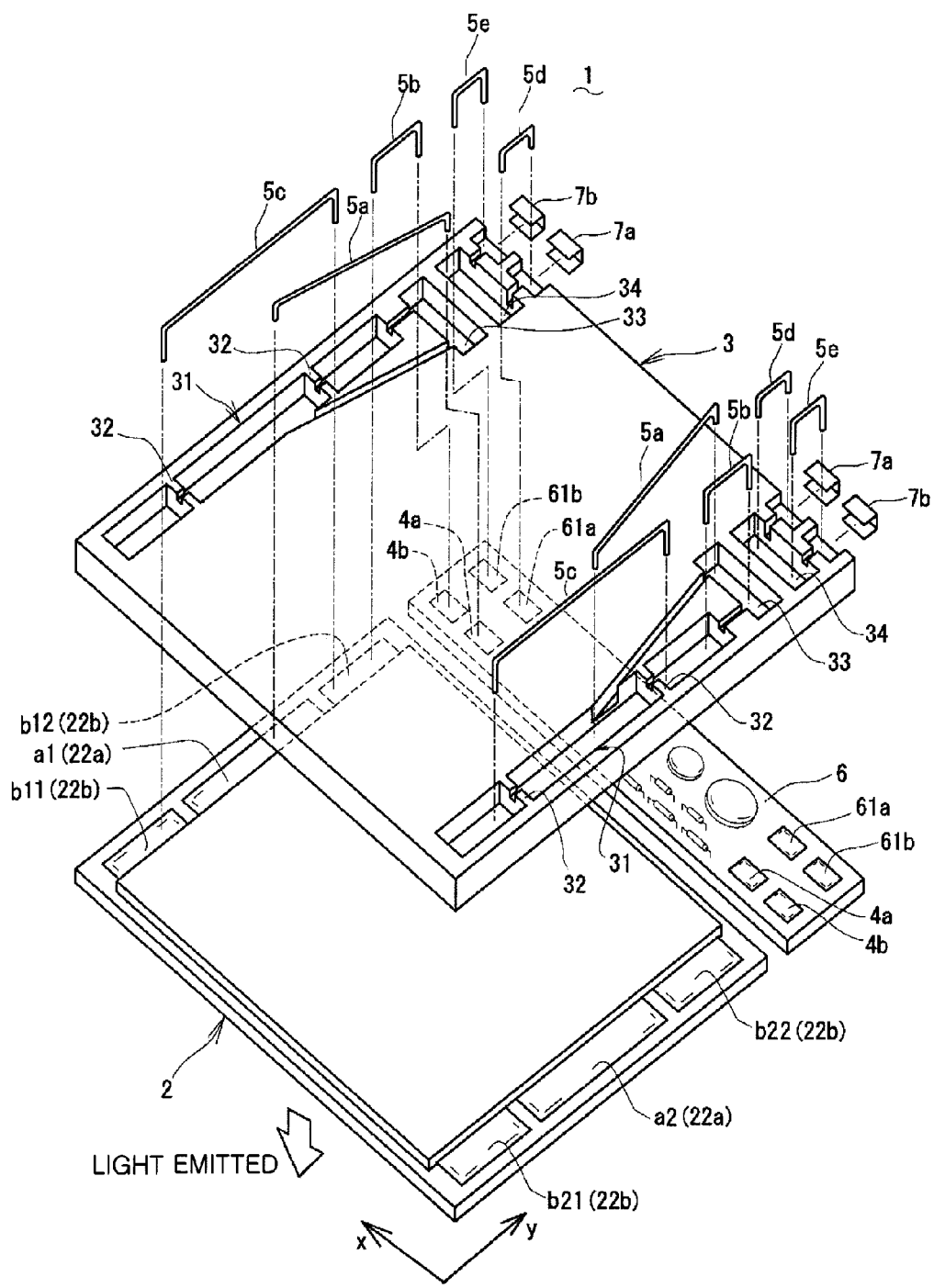
FIG. 6 is an exploded perspective view showing a light emitting module in accordance with a third embodiment of the present invention.
Figure 7:
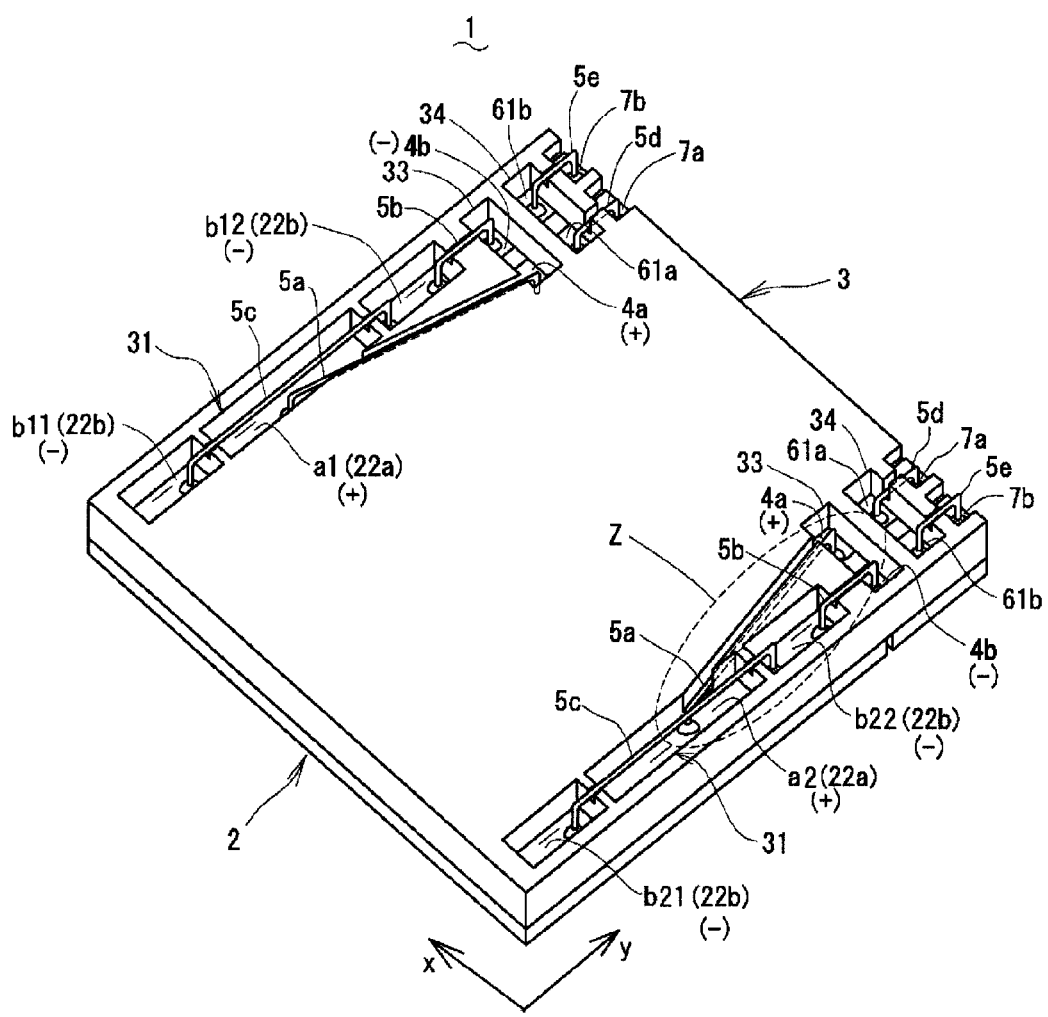
FIG. 7 is an assembled perspective view of the light emitting module of the third embodiment.

A light emitting module in accordance with a third embodiment of the present invention will be described with reference to FIGS. 6 through 9. As shown in FIGS. 6 and 7, the light emitting module 1 of the present embodiment is a circuit-incorporating light emitting module that includes a circuit board making up a power supply circuit for generating a regulated direct current to be supplied to the light emitting element 2 and/or a control circuit for controlling the electric power to be supplied to the light emitting element 2. The circuit board 6 is arranged at one lateral side of the light emitting element 2 and installed on the side of the support body 3 at which the light emitting element 2 exists. On the upper surface of the circuit board 6, there are provided left and right power feeding terminals 4a and 4b connected to the power feeding electrodes a1, a2, b12 and b22 of the light emitting element 2 and external terminals 61a and 61b connected to the left and right power feeding terminals 4a and 4b through wiring on the circuit board 6.

The light emitting element 2 and the circuit board 6 are bonded to the support body 3 by a double-side adhesive tape or the like.

Figure 8:
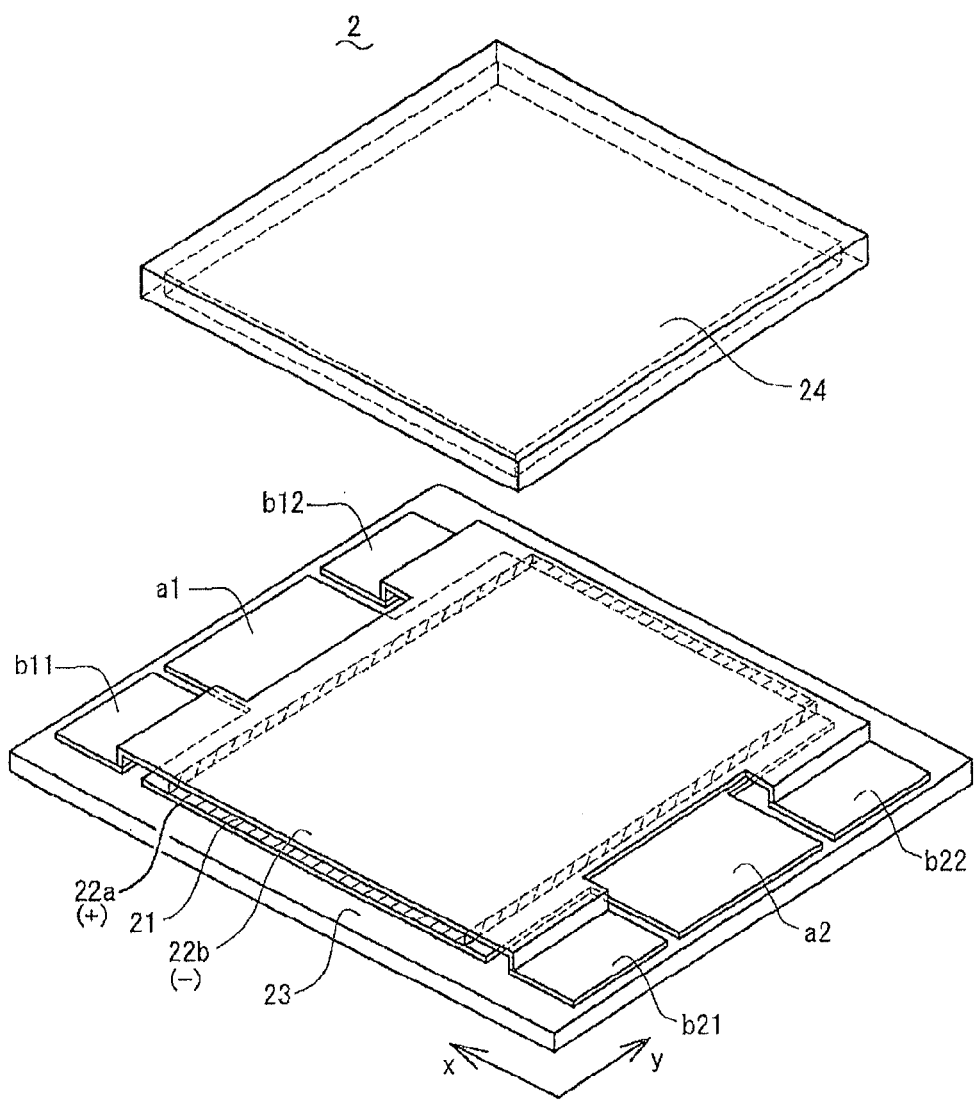
FIG. 8 is an exploded perspective view showing an organic EL light emitting element employed in the light emitting module of the third embodiment.

As shown in FIG. 8, the positive electrode 22a of the light emitting element 2 includes a pair of left and right lead-out portions a1 and a2 protruding outwards beyond the seal plate 24. The lead-out portions a1 and a2 are arranged in the middle areas of the element substrate 23 along the front-rear direction. The negative electrode 22b includes two pairs of left and right lead-out portions b11, b12, b21 and b22 protruding outwards beyond the seal plate 24. The lead-out portions b11 and b21 are arranged in the front areas on the element substrate 23, while the lead-out portions b12 and b22 are arranged in the rear areas on the element substrate 23.

The lead-out portions a1, a2, b11, b12, b21 and b22 are electrically connected to the positive and negative electrodes 22a and 22b and make up the power feeding electrodes of the light emitting element 2.

The support body 3 has openings 31 formed in the portions corresponding to the lead-out portions, i.e., the power feeding electrodes a1, a2, b11, b12, b21 and b22, and divided by two partition portions 32. Thus, there are formed independent openings corresponding to the power feeding electrodes a1, a2, b11, b12, b21 and b22. In addition, the support body 3 has openings 33 formed in the portions corresponding to the power feeding terminals 4a and 4b and openings 34 formed in the portions corresponding to the external terminals 61a and 61b. The power feeding terminals 4a are electrically connected to the corresponding left and right lead-out portions a1 and a2 of the positive electrode 22a by electric connection members 5a. The power feeding terminals 4b are electrically connected to the lead-out portions b12 and b22 of the negative electrode 22b by electric connection members 5b. The electric connection members 5a and 5b extend via the openings 31, the non-light emitting side (the rear side) of the support body 3 and the openings 33. In this regard, the power feeding electrodes b11 and b12 or the power feeding electrodes b21 and b22 of the negative electrode 22b are electrically connected to each other by electric connection members 5c extending via the openings 31 and the non-light emitting side (the rear side) of the support body 3. The external terminals 61a are electrically connected to the electrode plates 7a of the support body 3 by electric connection members 5d, while the external terminals 61b are electrically connected to the electrode plates 7b of the support body 3 by electric connection members 5e. The electric connection members 5d and 5e extend via the openings 34 and the non-light emitting side (the rear side) of the support body 3.

Electrode plates 7a and 7b are connected to an external power source (not shown). A direct current or an alternating current is supplied from the external power source to the circuit board 6 through the external terminals 61a and 61b electrically connected to the electrode plates 7a and 7b.

Figure 9:
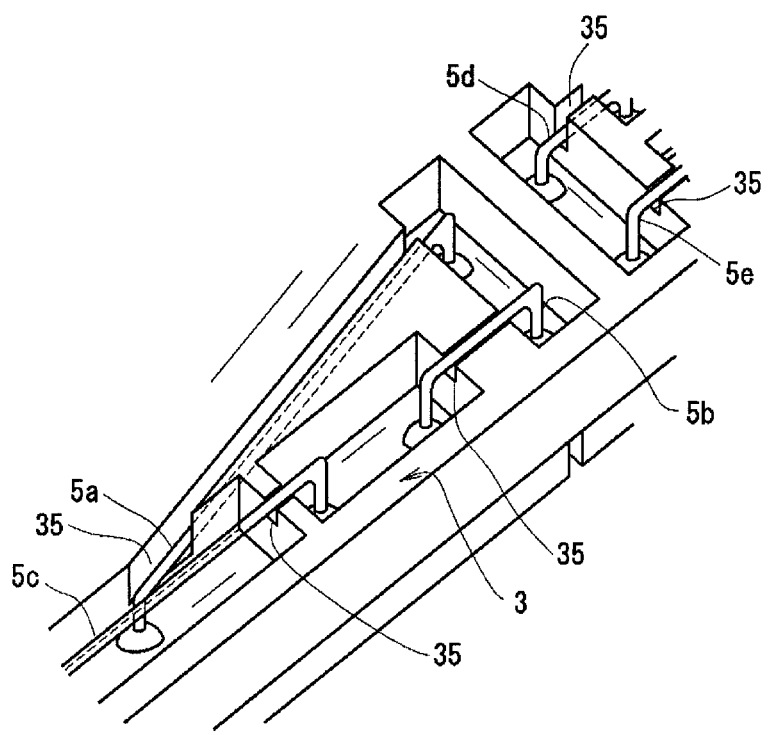
FIG. 9 is an enlarged view of the area designated by "Z" in FIG. 7.

As can be seen in FIG. 9, groove portions 35 for insertion of the electric connection members 5a to 5e are formed on the non-light emitting side (the rear side) of the support body 3. The depth of the groove portions 35 in the thickness direction of the light emitting module 1 varies with the polarities of the electric connection members 5a to 5e. In the present embodiment, the depth of the groove portions 35 for insertion of the electric connection members 5a and 5d is greater than the depth of the groove portions 35 for insertion of the electric connection members 5b, 5c and 5e.

With the present embodiment, it is possible to provide the circuit-incorporating light emitting module 1. Since there are formed the groove portions 35 for insertion of the electric connection members 5a to 5e and the depth of the groove portions 35 varies with the polarities of the electric connection members 5a to 5e, it is possible to three-dimensionally arrange the electric connection members 5a to 5e in the thickness direction of the light emitting module 1 with no likelihood of mutual contact. This increases the degree of freedom of wiring design and helps save the space of the present light emitting module while reducing the thickness thereof.

Fourth Embodiment

Figure 10:
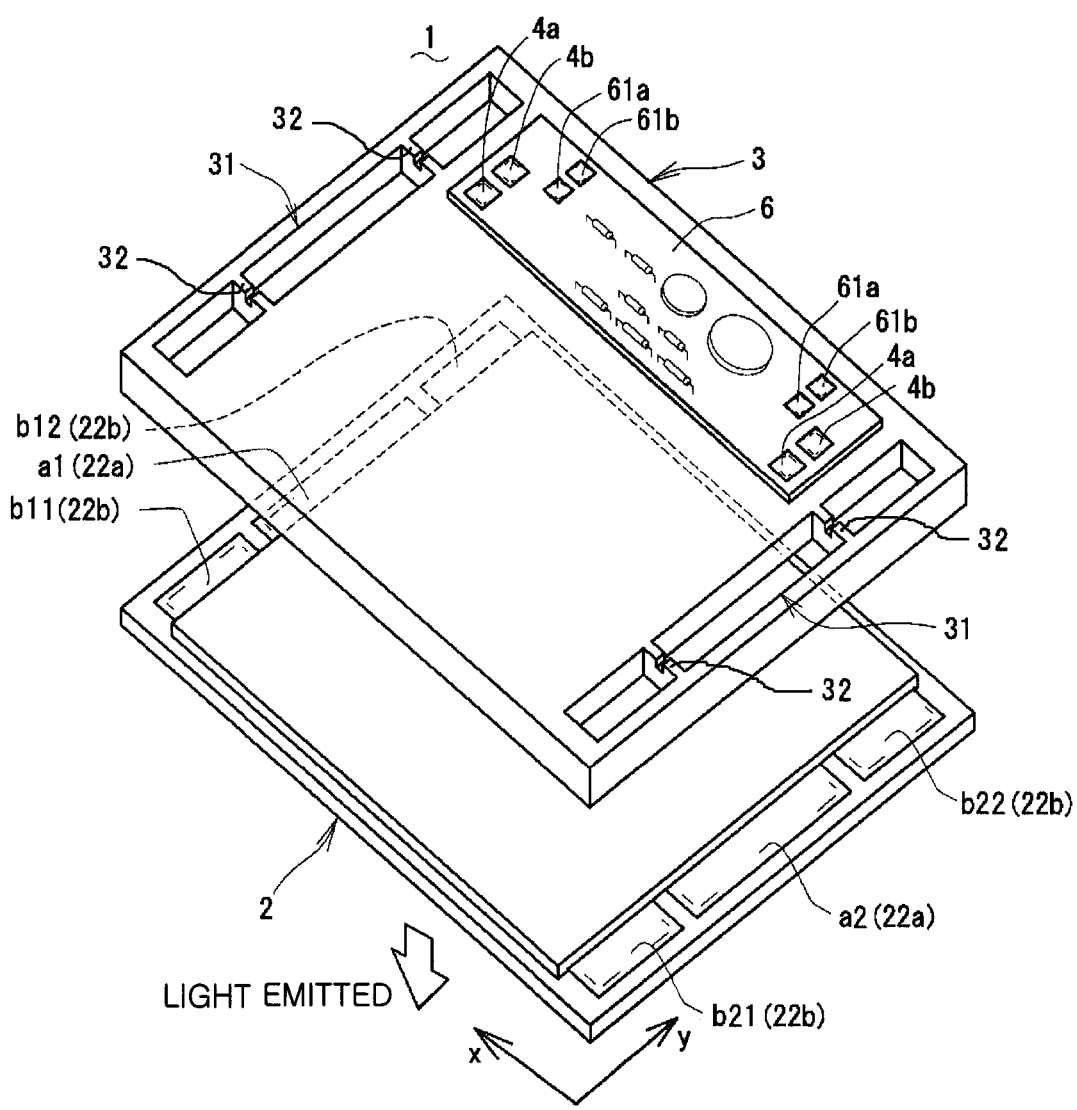
FIG. 10 is an exploded perspective view showing a light emitting module in accordance with a fourth embodiment of the present invention.
Figure 11:
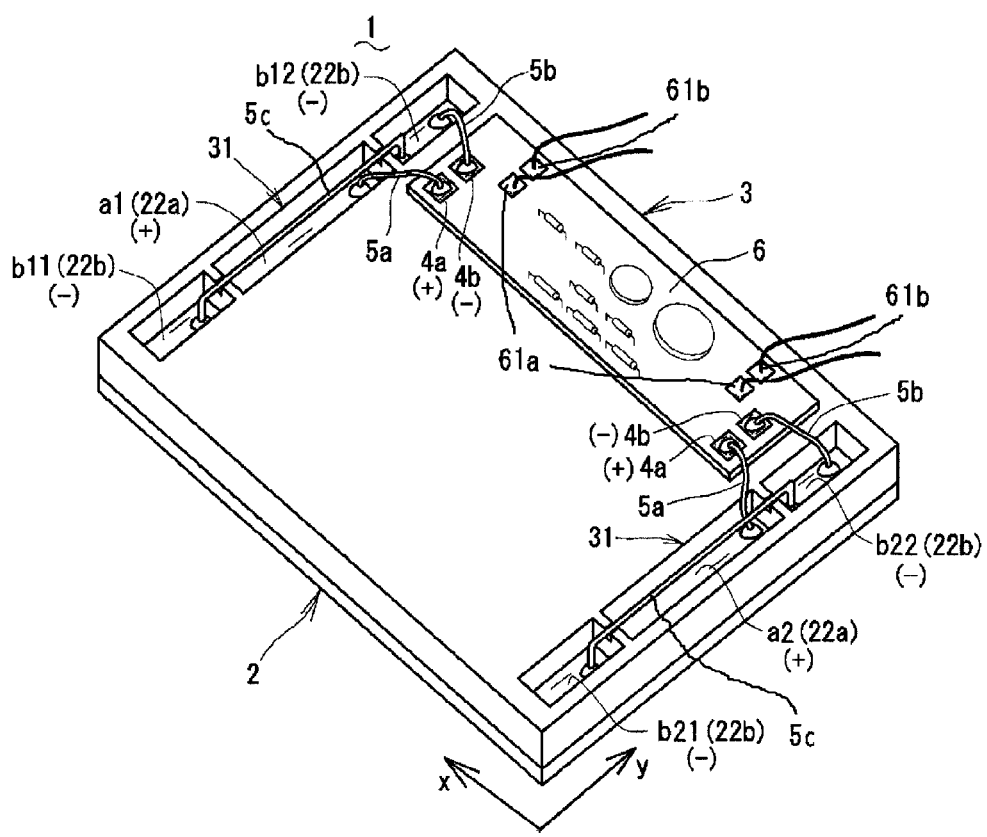
FIG. 11 is an assembled perspective view of the light emitting module of the fourth embodiment.

A light emitting module in accordance with a fourth embodiment of the present invention will be described with reference to FIGS. 10 and 11. As shown in these drawings, the light emitting module 1 of the present embodiment includes a circuit board 6 provided on the opposite side, i.e., the rear side, of the support body 3 from the side at which the light emitting element 2 exists. The circuit board 6 is positioned between the left and right openings 31 of the support body 3.

While the circuit board 6 of the third embodiment is arranged at one lateral side of the light emitting element 2 and installed on the side of the support body 3 at which the light emitting element 2 exists, the circuit board 6 of the present embodiment is arranged to interpose the support body 3 between itself and the light emitting element 2 in an overlapping relationship with the light emitting element 2.

On the upper surface of the circuit board 6, there are provided left and right power feeding terminals 4a and 4b connected to the power feeding electrodes of the light emitting element 2 and external terminals 61a and 61b connected to the left and right power feeding terminals 4a and 4b through the wiring lines within the circuit board 6.

The circuit board 6 is bonded to the rear surface of the support body 3 by a double-side adhesive tape or the like.

The support body 3 has openings 31 formed in the portions corresponding to the lead-out portions, i.e., the power feeding electrodes a1, a2, b11, b12, b21 and b22, and divided by two partition portions 32. Thus, there are formed independent openings corresponding to the power feeding electrodes a1, a2, b11, b12, b21 and b22. The power feeding terminals 4a are electrically connected to the corresponding left and right lead-out portions a1 and a2 of the positive electrode 22a by electric connection members 5a. The power feeding terminals 4b are electrically connected to the lead-out portions b12 and b22 of the negative electrode 22b by electric connection members 5b. The electric connection members 5a and 5b extend via the openings 31 and the non-light emitting side (the rear side) of the support body 3. In this regard, the power feeding electrodes b11 and b12 or the power feeding electrodes b21 and b22 of the negative electrode 22b are electrically connected to each other by electric connection members 5c extending via the openings 31 and the non-light emitting side (the rear side) of the support body 3. The external terminals 61a and 61b are connected to an external power source (not shown) through lead wires. Thus, a direct current or an alternating current is supplied from the external power source to the circuit board 6.

With the light emitting module 1 of the present embodiment, it is possible to reduce the non-light emitting area on the light emitting side (the front side) of the light emitting module 1 as compared with the light emitting module of the third embodiment in which the circuit board 6 is arranged at one lateral side of the light emitting element 2.

The present invention is not limited to the configurations of the foregoing embodiments but may be modified in many different forms without departing from the scope of the invention. For example, with respect to other structures than the electric connection structure between the power feeding electrodes and the power feeding terminals, the present invention is not limited to the connection structure arranged on the non-light emitting side (the rear side) of the support body 3. The electric connection members 5c, 5d and 5e may be arranged on the light emitting side of the support body 3 (namely, on the surface facing to the light emitting element 2).

While the invention has been shown and described with respect to the embodiments, it will be understood by those skilled in the art that various changes and modifications may be made without departing from the scope of the invention as defined in the following claims.

What is claimed is:

1. A light emitting module having a light emitting surface and a non-light emitting surface opposite from the light emitting surface, comprising:
    an organic EL light emitting element of thin plate shape including a light emitting layer made of an organic compound and positive and negative electrodes for interposing the light emitting layer therebetween; and
    a support body for supporting the organic EL light emitting element, the support body including a non-light emitting side,
    wherein the support body is attached to the organic EL light emitting element at the side of the non-light emitting surface of the light emitting module to cover one surface of the organic EL light emitting element;
    the organic EL light emitting element includes power feeding electrodes electrically connected to the positive and negative electrodes;
    the support body includes openings formed in corresponding relationship with the power feeding electrodes, so that the power feeding electrodes are exposed on the non-light emitting side of the support body through the openings; and
    the support body includes power feeding terminals for supplying electric power to the organic EL light emitting element, the power feeding terminals having a portion exposed on the non-light emitting side of the support body, the power feeding terminals being electrically connected to the power feeding electrodes by electric connection members extending via the non-light emitting side and the openings of the support body.

2. The light emitting module of claim 1, wherein the power feeding electrodes of the organic EL light emitting element include positive and negative power feeding electrodes electrically connected to the positive and negative electrodes, the openings of the support body independently arranged in a corresponding relationship with the positive and negative power feeding electrodes.

3. The light emitting module of claim 2, wherein the positive and negative power feeding electrodes are arranged in an adjoining relationship with each other, the openings of the support body divided by partition portions to isolate the power feeding electrodes of different polarities from each other and independently arranged in a corresponding relationship with the power feeding electrodes of different polarities.

4. The light emitting module of claim 1, further comprising a circuit board making up a circuit for generating and/or controlling the electric power to be supplied to the organic EL light emitting element,
    wherein the circuit board is provided on the side of the support body at which the organic EL light emitting element is supported, the circuit board being arranged side by side with respect to the organic EL light emitting element;
    the power feeding terminals are provided on the circuit board; and
    the support body includes openings formed in a corresponding relationship with the power feeding terminals, the power feeding terminals being exposed on the non-light emitting side of the support body through the additional openings.

5. The light emitting module of claim 1, further comprising a circuit board making up a circuit for generating and/or controlling the electric power to be supplied to the organic EL light emitting element,
    wherein the circuit board is provided on the opposite side of the support body from the side at which the organic EL light emitting element is supported; and
the power feeding terminals are provided on the circuit board and exposed on the non-light emitting side of the support body.

6. The light emitting module of claim 3, wherein groove portions for insertion of the electric connection members are formed on the non-light emitting side of the support body.

7. The light emitting module of claim 4, wherein groove portions for insertion of the electric connection members are formed on the non-light emitting side of the support body.

8. The light emitting module of claim 5, wherein groove portions for insertion of the electric connection members are formed on the non-light emitting side of the support body.

9. The light emitting module of claim 6, wherein the thickness direction depths of the groove portions vary with the polarities of the electric connection members.

10. The light emitting module of claim 7, wherein the thickness direction depths of the groove portions vary with the polarities of the electric connection members.

11. The light emitting module of claim 8, wherein the thickness direction depths of the groove portions vary with the polarities of the electric connection members.

* * * * *